United States Patent [19]

Nakajima et al.

[11] Patent Number: 4,701,918

[45] Date of Patent: Oct. 20, 1987

[54] LOGIC ANALYZER

[75] Inventors: Takayuki Nakajima, Gyoda; Tetsuo Aoki, Kohnosu; Katsumi Kobayashi, Gyoda; Noboru Akiyama, Kumagaya, all of Japan

[73] Assignee: Takeda Riken Kogyo Kabushikikaisha, Tokyo, Japan

[21] Appl. No.: 737,467

[22] Filed: May 24, 1985

[30] Foreign Application Priority Data

May 28, 1984 [JP] Japan ................................. 59-108919
May 28, 1984 [JP] Japan ................................. 59-108920

[51] Int. Cl.$^4$ ...................... G01R 31/28; G06F 11/00
[52] U.S. Cl. ........................................ 371/20; 371/27; 324/73 R
[58] Field of Search ........................ 371/15, 16, 20, 24, 371/25, 27, 29; 364/200 MS File, 900 MS File; 324/73 R

[56] References Cited

U.S. PATENT DOCUMENTS

| | | | |
|---|---|---|---|
| 3,909,792 | 9/1975 | Harris | 340/745 X |
| 4,216,374 | 8/1980 | Lam | 371/27 |
| 4,313,200 | 1/1982 | Nishiura | 371/20 X |
| 4,425,643 | 1/1984 | Chapman | 371/20 |
| 4,434,488 | 2/1984 | Palmquist | 371/15 |
| 4,450,442 | 5/1984 | Tanaka | 340/745 X |
| 4,450,560 | 5/1984 | Conner | 371/27 X |
| 4,467,324 | 8/1984 | Bachman | 340/745 X |
| 4,503,536 | 3/1985 | Panzer | 371/26 X |
| 4,584,683 | 4/1986 | Shimizu | 371/27 X |
| 4,601,033 | 7/1986 | Whelan | 324/73 R X |

OTHER PUBLICATIONS

M. Gatrell, "Automatically Generating Efficient Testing Sequences . . . ", IBM Tech. Bull., V19, No. 4, 9/1976, pp. 1448–1449.

Primary Examiner—Jerry Smith
Assistant Examiner—Robert W. Beausoliel, Jr.
Attorney, Agent, or Firm—Staas & Halsey

[57] ABSTRACT

A logic analyzer applies test pattern signals from a pattern generator to a circuit under test and sequentially reads logic outputs into a memory. The output from the circuit under test when it reaches a predetermined logic state is input as an external control signal into the logic analyzer. A change command is generated from the pattern generator in relation to the generation of the test pattern signal. When the change command and the external control signal are obtained at the same time, and flow of the generation of the test pattern signals is changed to a predetermined flow.

3 Claims, 22 Drawing Figures

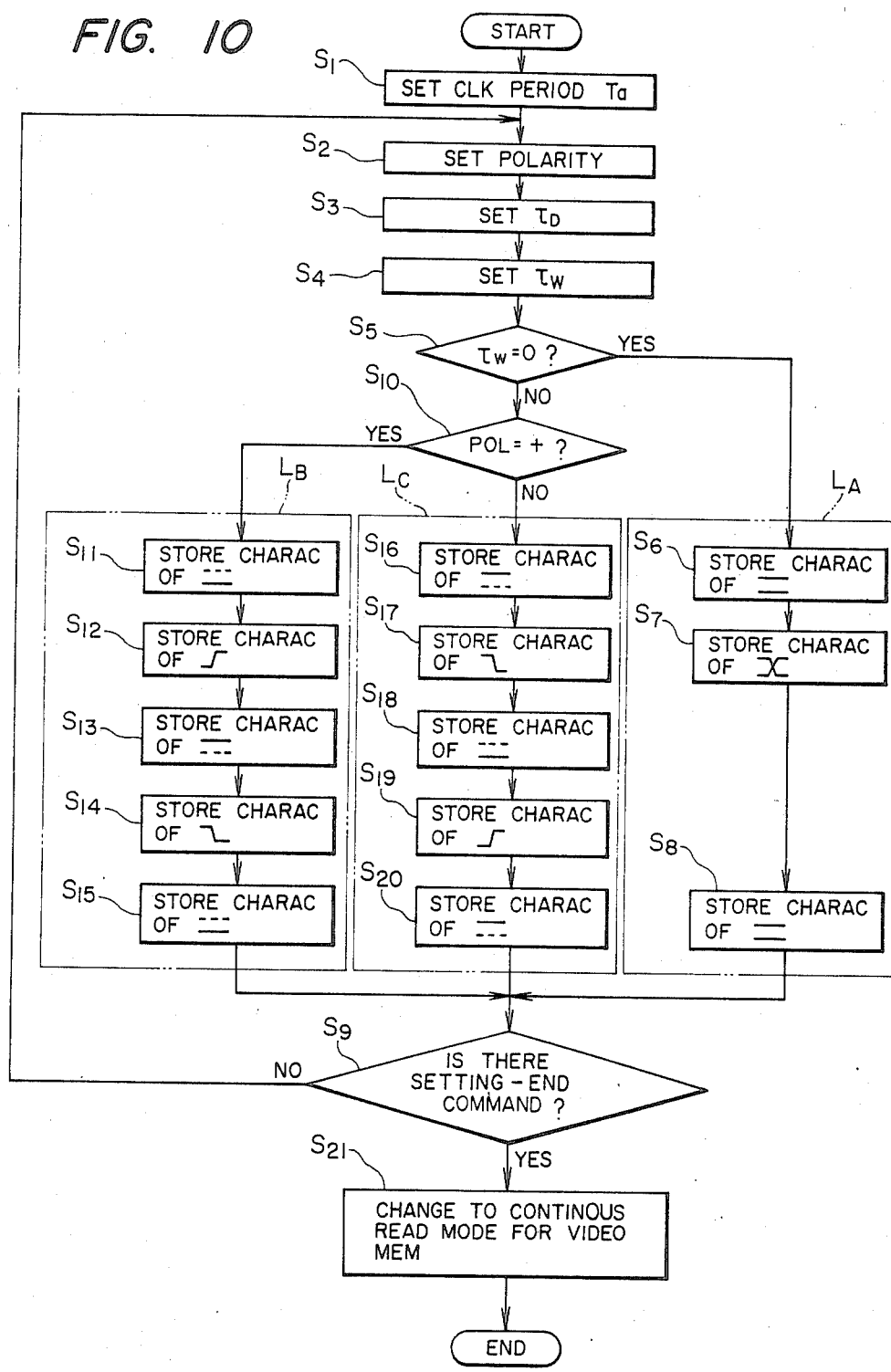

LOGIC ANALYZER

CROSS REFERENCES TO RELATED APPLICATIONS

This application is related to U.S. application Ser. No. 737,466.

BACKGROUND OF THE INVENTION

The present invention relates to a logic analyzer which applies test pattern signals to a circuit under test, sequentially reads the output data therefrom into a memory and reads out therefrom the data for analysis or display.

Heretofore there has been proposed in, for example, U.S. Pat. Nos. 4,425,643 and 4,434,488, a logic analyzer which reads waveform outputs occurring at respective parts of a logic circuit and displays output waveforms from which the operator judge whether the logic circuit is correctly operating or not. With this kind of logic analyzer, since the operator passes judgement on the operation of the circuit under test on the basis of the timing of the plurality of logic waveforms being displayed, he is required to be well versed in the operation of the circuit under test. Accordingly, much skill is needed for the test using such a logic analyzer.

Recently there has come into use a logic analyzer of the type that applies a test pattern signal from a simple pattern generator to the circuit under test and obtains the response output therefrom for observation, and that perform in analysis or comparison with an expected value so as to judge whether the circuit under test is non-defective or defective.

The test pattern signal must be chosen properly in accordance with the function of the circuit under test. For example, a logic circuit performing a counting operation and a logic circuit performing a logic operation entirely differ in the flow of the test pattern signal. Therefore, in the case where the circuit under test includes, for example, a counting operation part and a logic operation part and repeats an operation such that, for instance, when the count value reaches a certain value, a certain logic operation circuit operates and the counter operates again based on the logic operation result, it is necessary that the test pattern signal generating condition of the pattern generator differ depending upon which of the counter and the logic operation circuit is in operation. Further, there are cases where the test pattern signal generating parameters are changed when a certain malfunction is detected during the test of a circuit having one function.

To meet the abovesaid requirements, there has been proposed such a method that when the logic state of the circuit under test reaches a predetermined logic state, a signal indicating this is produced and used as an interrupt signal to thereby change the test pattern signal generating parameters. In some cases, however, the time when the circuit under test is put in the predetermined logic state varies under the influence of an external signal, or the circuit is repeatedly put in the predetermined logic state. Therefore, the above interruption system has the disadvantage that when the circuit under test satisfies the predetermined logic condition, even if the pattern generator is executing a program of generating a series of test pattern signals, the flow of generation of the test pattern signals is changed over. That is, predetermined kinds of test pattern signals are applied from the pattern generator to the circuit under test all to test its functions, but if the generation of a certain series of test pattern signals is switched to the generation of another series of test pattern signals, then the circuit under test cannot be completely tested.

Since the logic analyzer is used for testing a logic circuit, it is required to permit free setting of the waveform of the test pattern signal. Namely, the logic analyzer is designed to permit freely setting, as the test pattern signal waveform, an NRZ or RZ waveform and, in the case of the latter, its polarity, delay time $\tau_D$ relative to the reference timing and pulse width $\tau_W$.

Conventionally, when the conditions of the waveform of each test pattern signal to be generated are set, the polarity is displayed in the form of a symbol and the delay time $\tau_D$ and the pulse width $\tau_W$ in numerical form. Accordingly, it is impossible for the operator to intuitively know what test pattern signals have been set. Accordingly, the operator has to imagine the waveforms of a plurality of test pattern signals to be generated and their mutual phase relationships from the displayed numeric values and symbols, so as to judge whether the waveform conditions being set are appropriate or not. When two or three kinds of test pattern signals are to be generated, the waveform conditions can be set without much difficulty, but as the number of types of test pattern signals to be generated increases, it becomes more and more difficult for the operator to imagine what waveforms the test pattern signals will assume and what phase relationships they will bear. Therefore, the waveform conditions of the test pattern signals cannot easily be set.

SUMMARY OF THE INVENTION

It is therefore an object of the present invention to provide a logic analyzer which is designed so that only when a circuit under test satisfies a predetermined condition and the generation of a series of test pattern signals is completed at that time, is the flow of generation of test pattern signals changed, making it possible to perform all predetermined tests of the circuit.

Another object of the present invention is to provide a logic analyzer which is designed so that the waveform conditions of test pattern signals to be generated are displayed, along with their waveforms, thereby permitting error-free and quick setting of waveform conditions of a number of test pattern signals.

According to the present invention, in a logic analyzer of the type in which test pattern signals are applied from a pattern generator to a circuit under test and its output data is read into a memory, a change command for changing the test is generated by test change command generating means in relation to the generation of the test pattern signals from the pattern generator, the output available from the circuit under test is applied as an external control signal from an input probe and, when coincidence is detected between the external control signal and the change command, the flow of generation of the test pattern signals is switched by the change means to a predetermined flow. Even when the circuit under test has thus been put in the predetermined state, if the generation of a series of test pattern signals has not yet been completed, the change command is not issued, so that there is no possibility that the flow of the test pattern signal generation is changed in the course of generating a series of test pattern signals, leaving some tests undone. Namely, the change command is set to be issued after the completion of generation of a series of test pattern signals so that no trouble will be caused by the change of the flow of test pattern signal generation.

In the case where the pattern generator reads out a program from a microde memory and reads out pattern data from a pattern memory under control of the program, the abovesaid change command can be stored in the microde memory. The change command may also be added to specified pattern data in the pattern memory. The predetermined state of the circuit under test may sometimes be detected by detecting that signals at a plurality of places in the circuit under test assume a specific state. In such a case, the change command is stored in the microde memory and, at the same time, the specific state is stored as a signal indicating the state to be changed. The state indicating signal and a signal from an input probe of the circuit under test are compared and, only when coincidence is detected between them, is an instruction being read out at that time executed.

When waveform conditions of the test pattern signals to be generated from the pattern generator are applied to a control unit for setting, they are displayed as numerals and symbols on the screen of a display as in the prior art. According to the present invention, however, means is provided by which waveforms determined by the set waveform conditions are displayed corresponding to the arrangements of the displayed numerals and symbols of the set waveform conditions. To this end, the waveforms are resolved into partial graphic forms, each partial graphic form corresponding to a display of one character. The respective partial graphic forms are assigned character codes, and dot patterns of the partial graphic forms are stored in a graphic pattern generator, and further, the character codes of the partial graphic forms representing the respective parts of the waveform to be displayed are each written in a video memory at an address corresponding to the character position on the screen where it is to be displayed. In the video memory character codes representing the abovesaid numerals and symbols are stored at addresses corresponding to the positions on the screen where they are to be displayed. The video memory is read out in synchronism with the scanning of the screen of the display for display thereon.

Accordingly, even in the case of setting waveforms of a relatively large number of test pattern signals, since the waveforms of the input test pattern signals are displayed, the operator will easily recognize their interrelations. Further, a setting error can also be immediately noticed and corrected to generate a predetermined test pattern. By displaying the test pattern signal waveforms together with time base graduations, the interrelations of the waveforms can be observed with more certainty.

BRIEF DESCRIPTION OF THE DRAWINGS

FIG. 10 is a flowchart showing an example of a processing operation for setting waveforms of test pattern signals.

DESCRIPTION OF THE PREFERRED EMBODIMENTS

Figure 1:
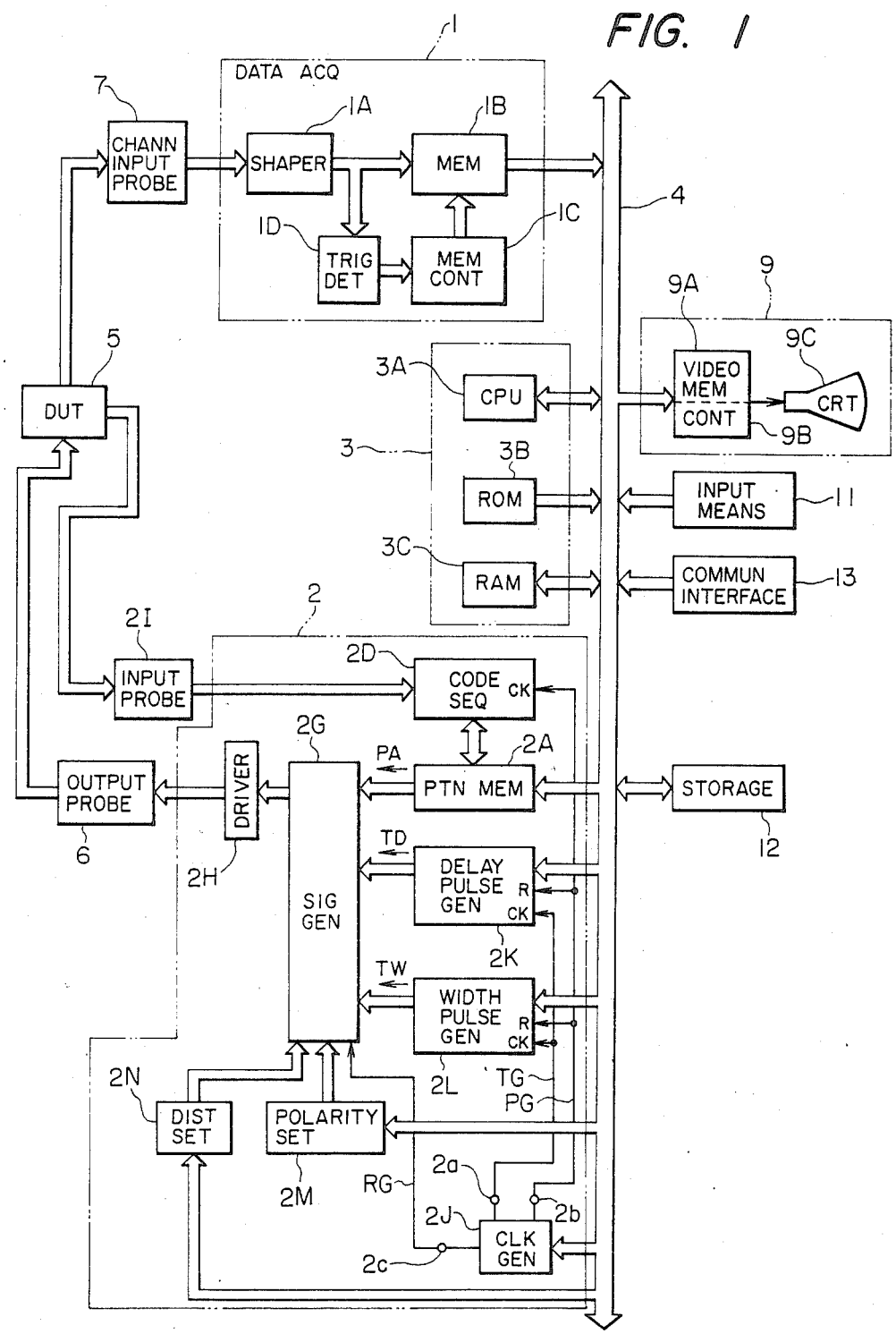
FIG. 1 is a block diagram illustrating an example of the logic analyzer of the present invention.

FIG. 1 illustrates, by way of example, the entire arrangement of the logic analyzer of the present invention which is provided with a pattern generator. A data acquisition device 1 and a pattern generator 2 are connected via a bus line 4 to a control unit 3 and placed under the control thereof.

In the pattern generator 2 pattern data, delay data and width data are transferred from the control unit 3 to and stored in a pattern memory 2A, a delayed pulse generator group 2K and a with pulse generator group 2L, respectively. These pattern, delay and width data are entered from a keyboard or like input means 11 at the start of a test, but data set before may be stored in a storage 12 such as a floppy disc unit and fetched therefrom into the control unit 3. Incidentally, the pattern memory 2A stores microcodes into which, instructions of a program for defining pattern generating conditions have been encoded.

A microscode sequence 20 generates a sequence of addresses for reading out the pattern memory 2A. In a clock generator 2J is set a pattern generation period from the control unit 3, and the clock generator 2J yields at its terminals 2a, 2b and 2c a TG clock derived from a fundamental clock, a PG clock which is a pattern generating clock synchronized with the TG clock and having a period which is an integral multiple of that of the TG clock and a retiming clock.

A delay pulse generator group 2K and a width pulse generator group 2L respectively have stored therein plural, for example, eight delay data and width data, and they generate delay pulses TD delayed behind reference timing and width pulses TW in accordance with the delay data and width data, respectively. The delay pulses TD and the width pulses TW are supplied to a signal generator 2G, along with pattern data read out of the pattern memory 2A. The signal generator 2G generates RZ or NRZ signals which have the logic values of the input pattern data and each of which is delayed for a time $\tau_D$ relative to the reference timing and has a pulse width $\tau_W$ defined by a corresponding one of pairs of the input delay pulses TD and width pulses TW. These plural, for example, eight signals are respectively controlled in polarity by corresponding polarity control signals set in a polarity setting register 2M. The polarity-controlled signals are supplied to one or more drivers in a driver group 2H in accordance with distribution control signals set in a distribution setting register 2N. The polarity control signals and the distribution control signals are set by the control unit 3 in the polarity setting register 2M and the distribution setting register 2N.

Figure 2:
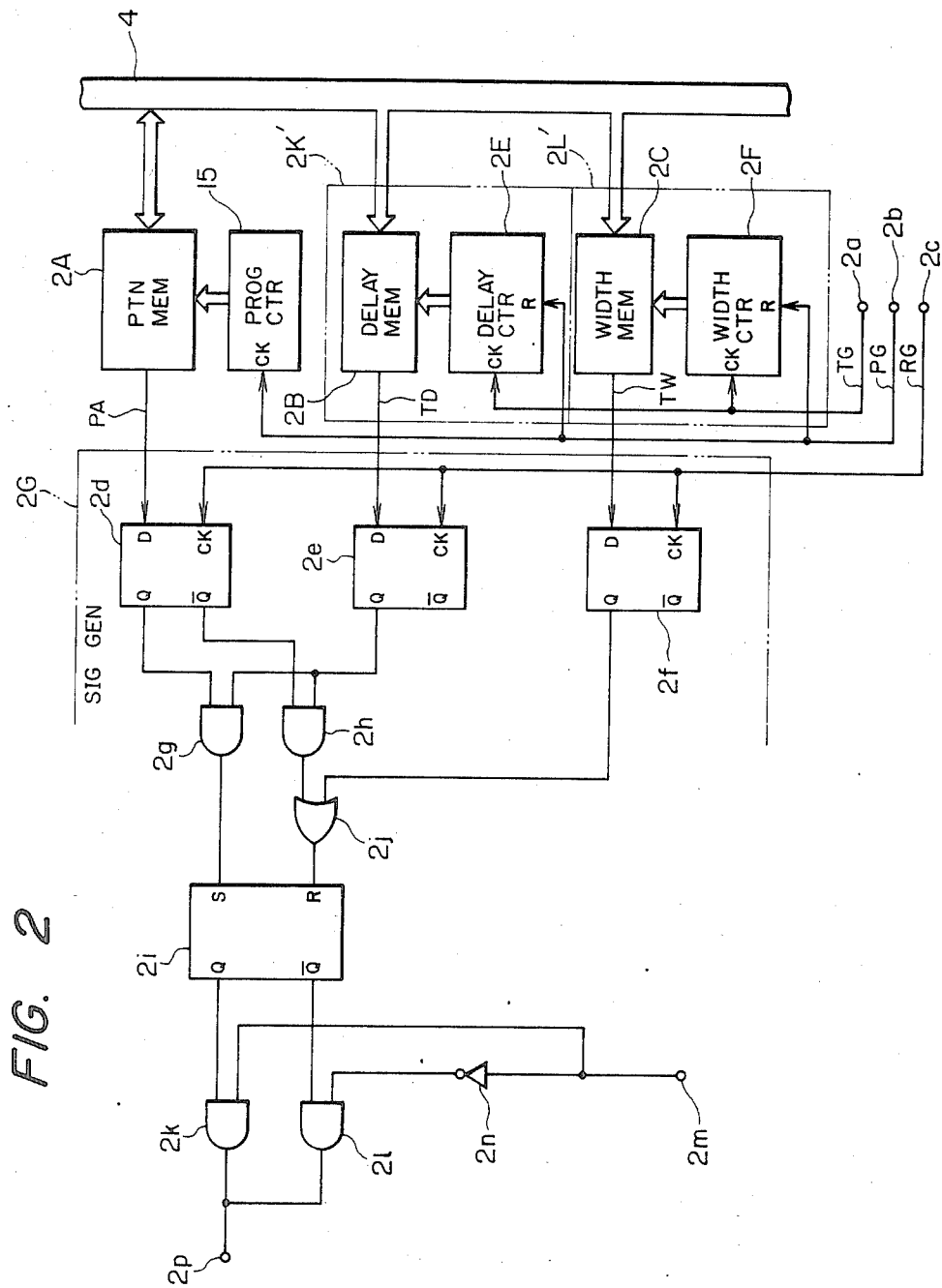
FIG. 2 is a block diagram illustrating a specific operative example of a part of a pattern generator 2 used in FIG. 1.
Figure 3:
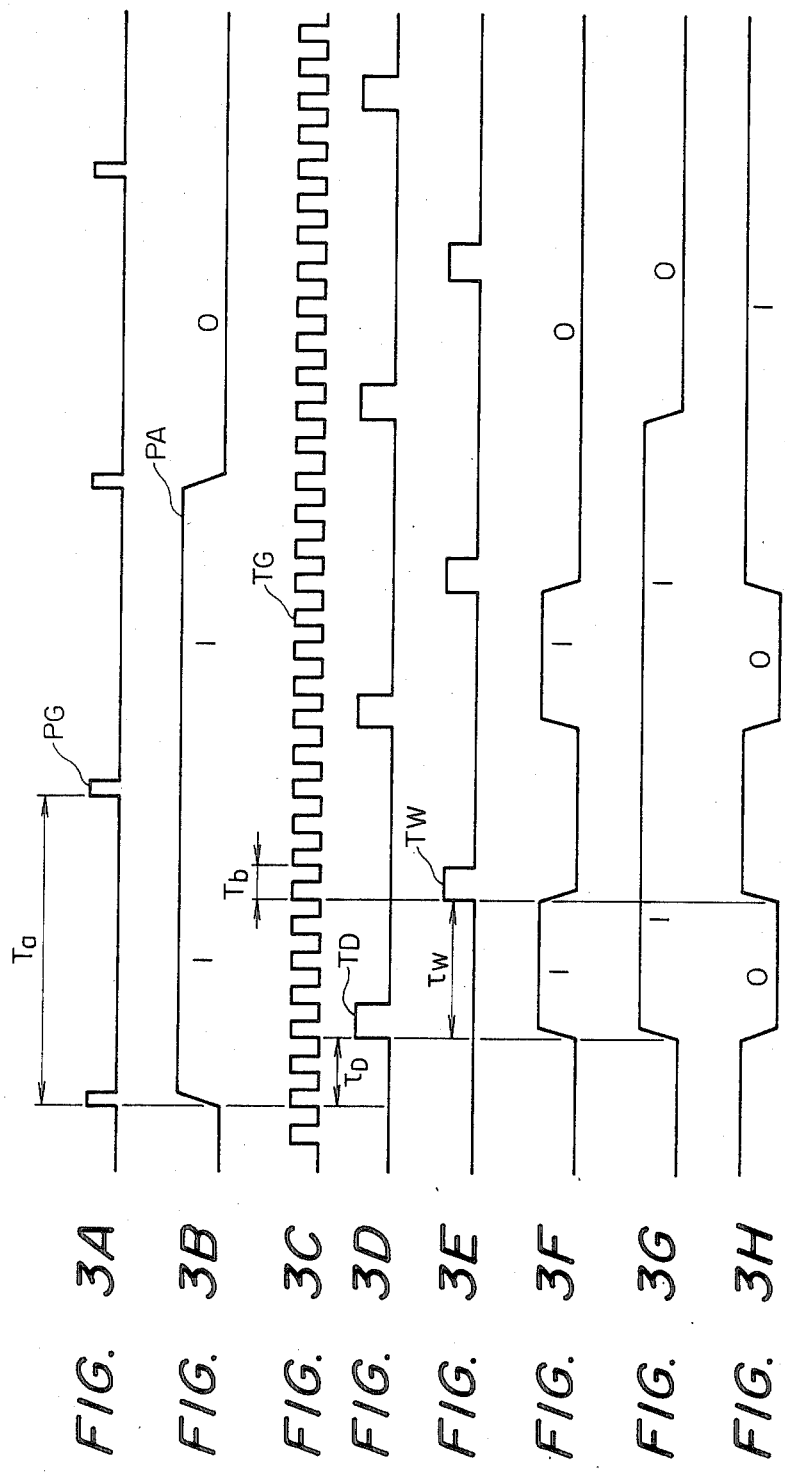
FIGS. 3A to 3H are timing charts for explaining the operation of the example depicted in FIG. 2.

FIG. 2 illustrates a specific operative example of the arrangement for generating one signal by one delay pulse generator 2K′, one width pulse generator 2L′ and the pattern memory 2A in the signal generator 2G. The delay pulse generator 2K′ is provided with a delay memory 2B and a delay counter 2E, and the width pulse generator 2L′ is provided with a width memory 2C and a width counter 2F. Delay data indicating the delay time $\tau_D$ relative to the reference timing and width data indicating the pulse width $\tau_W$ are respectively prestored in the delay memory 2B and the width memory 2C from the control unit 3 (FIG. 1). A program counter 15 included in the sequencer 2D counts the PG clock of the period Ta from the terminal 2b, shown in FIG. 3A, and the pattern memory 2A is read out by the count contents of the program counter 15. FIG. 3B shows an example of pattern data PA having successive values "1, 1, 0" thus read out of the pattern memory 2A. The delay counter 2E and the width counter 2F are both reset by the PG clock and count the TG clock from the terminal 2a, shown in FIG. 3C. The delay memory 2B comprises a coincidence detector (not shown) which compares the delay data stored in the memory 2B and the content of the delay counter 2E and, upon detection of a coincidence therebetween, produces the delay pulse $\tau_D$ delayed for the time $\tau_D$ relative to the reference timing (the PG clock) as shown in FIG. 3D. Similarly, the width memory 2C comprises a coincidence detector (not shown) which compares the width data stored in the memory 2C and the content of the width counter 2F and, upon detection of a coincidence therebetween, produces the width pulse TW delayed for the time $\tau_W$ relative to the delayed pulse TD as shown in FIG. 3E. In the foregoing arrangement, since both the counters 2E and 2F are reset by the PG clock pulses, the width memory 2C is prestored with a value $\tau_D + \tau_W$ as the width data.

The read-out pattern data PA and the thus generated delay pulse TD and width pulse TW are respectively applied to data terminals D of D flip-flops 2d, 2e and 2f for retiming use in the signal generator 2G. A retiming clock signal RG is provided to clock teminals ck of the flip-flops 2d, 2e and 2f from the terminal 2c. The outputs at output terminals Q and $\overline{Q}$ of the flip-flop 2d are applied to AND circuits 2g and 2h, which is supplied with the output from an output terminal Q of the flip-flop 2e as well. The output of the AND circuit 2g is provided to a set terminal S of an RS flip-flop 2i, to the reset terminal R of which is supplied via an OR circuit 2j the output of the AND circuit 2h and the output from an output terminal Q of the flip-flop 2f. Though not shown in the drawing, a delay means for timing adjustment use is provided between the Q output of the flip-flop 2f and the input of the OR circuit 2j. The outputs at output terminals Q and $\overline{Q}$ of the flip-flop 2i are applied to gates 2k and 2l, respectively. The polarity control signal is applied directly to the gate 2k from one output terminal 2m of the polarity setting register 2M, and at the same time, it is provided via an inverter 2n to the gate 2l. The outputs of the gates 2k and 2l are supplied to a terminal 2p which is one of the outputs of the signal generator 2G.

In the case where the pattern data PA is at the high level as shown in FIG. 3B, when the delay pulse TD is generated, the flip-flop 2i is set by the output of the AND circuit 2g and then it is reset by the width pulse TW. If the polarity control signal at the terminal 2m is at the "1" level, the output of the flip-flop 2i (FIG. 3F) is provided as a positive RZ signal to the terminal 2p via the gate 2k. When the polarity control signal is at the "1" level, the output of the flip-flop 2i is provided via the gate 2l to the terminal 2p, obtaining a negative RZ signal, as shown in FIG. 3H. In the case of generating a NHZ signal, that is, in the case where the width data stored in the width memory 2C indicates that the pulse width $\tau_W$ is zero, when the read-out pattern data PA goes down to the low level, the flip-flop 2i is reset by the output from the AND circuit 2h upon occurrence of the delay pulse TD immediately thereafter. Conversely, when the pattern data PA rises to the high level, the flip-flop 2i is set by the output from the AND circuit 2g upon occurrence of the immediately subsequent delayed pulse TD. IN consequence, an NRZ signal is produced.

Turning back to FIG. 1, the output of the pattern generator 2, that is, the output pattern signal of the driver group 2H is applied via an output probe 6 of, for example, 644 channels, to each input terminal of a circuit under test 5. Signals from one or more predetermined circuit points of the circuit under test 5 are input via an input probe 21 into the pattern generator 2, wherein they are applied to the microcode sequencer 2D.

Connected to the input side of the data acquisition unit 1 is, for example, a 644-channel input probe 7, which is, in turn, connected to each output terminal of the circuit under test 5 so that the output therefrom is provided as a signal under test to a waveform shaping circuit 1A via the input probe 7. In the waveform shaping circuit 1A it is decided in synchronism with a clock in the circuit tester whether the signals under test are at the H or L logic, and they are stored in a memory 1B while being normalized in timing. The memory 1B is controlled by a memory control circuit 1C to store the signals under test in succession. When coincidence is detected by a trigger word detector 1D between the input signal under test and a preset trigger word, a write end signal is applied to the memory control circuit 1C a preset delay time after the detection of coincidence, stopping the writing in the memory 1B.

The control unit 3 comprises a central processor unit 3A, a read-only memory (hereinafter referred to as ROM) 3B and a random access memory (hereinafter referred to as RAM) 3C. In the ROM 3B is stored a program for operating, in a predetermined sequence, the data acquisition unit 1, the pattern generator 2 and a display 9 described later. In the RAM 3C are stored pattern data (the polarity of a pattern signal, data on the delay time relative to the reference timing, pulse width data) for pattern generation use, entered from input means 11, and the microcode. The pattern data, the microcode and the delay and the width data are respectively transferred to and stored in the pattern memory 2A, the delay memory 2B and the width memory 2C of the pattern generator 2. The pattern data, the microcode and the delay and the width data can be input into the storage 12 such as a floppy disc via a communication interface 13 from the outside.

The display 9 comprises a video memory 9A, a controller 9B for readout control of the video memory 9A and a cathode ray tube or like scanning type display 9C. Data stored in the video memory 9A is repeatedly read out for display on the display 9C.

Figure 4:
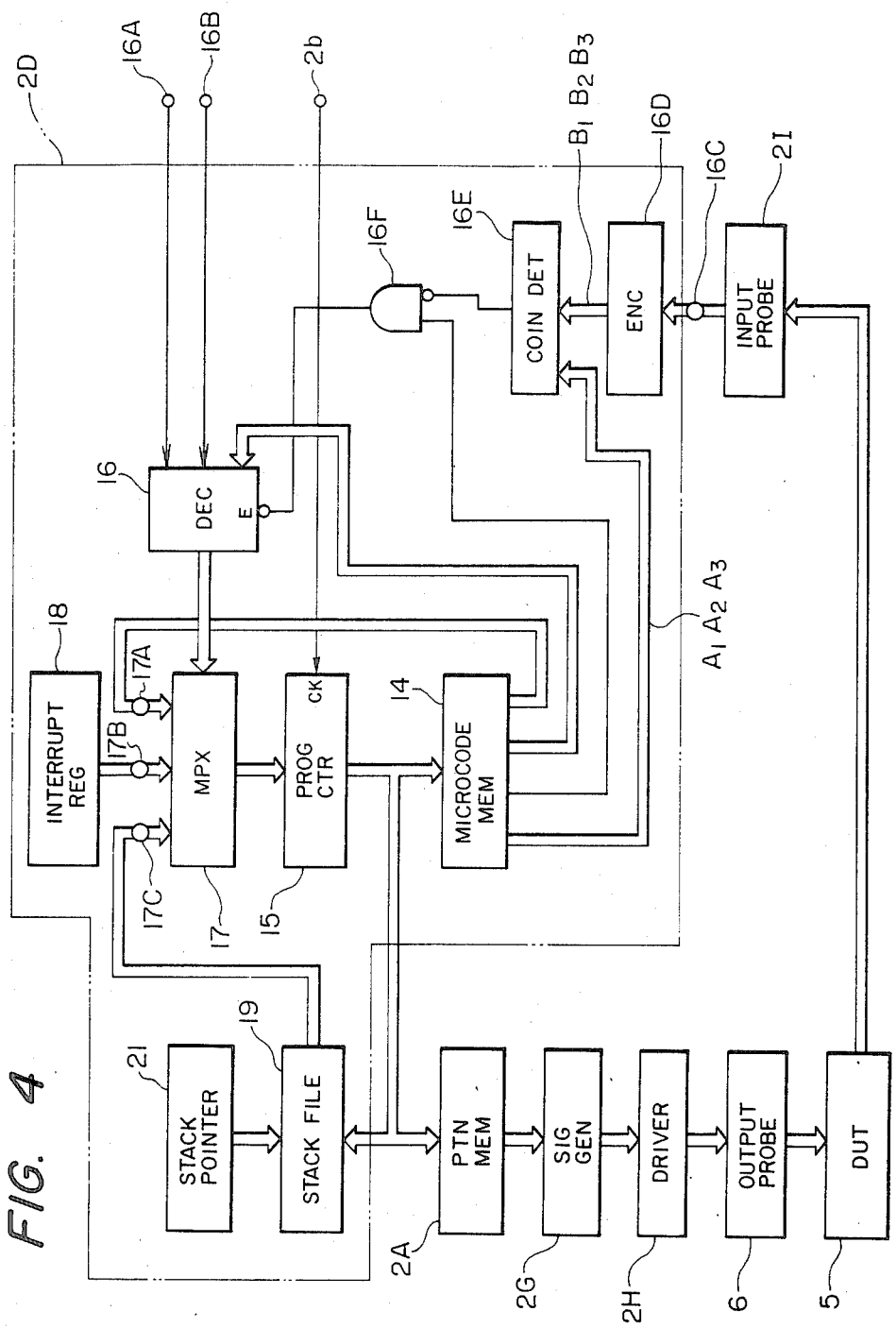
FIG. 4 is a block diagram illustrating a specific operative example of a microcode sequencer 2D utilized in FIG. 1.

FIG. 4 illustrates a specific operative example of the microcode sequencer 2D in connection with several other parts used in FIG. 1. In this example, a microcode memory 14 is shown to be separate from the pattern memory 2A. The microcode memory 14 and the pattern memory 2A are each read out by an address signal from a program counter 15. From the microcode memory 14 are read out an instruction to be executed next, a branch address and so forth.

The instruction read out of the microcode memory 14 is input into a microcode decoder 16, wherein it is interpreted. To the microcode decoder 16 are provided via input terminals 16A and 16B an interrupt signal (INTERRUPT) and a pause signal (PAUSE) as external control signals. Further, a plurality of external control signals indicating the status of the circuit under test 5 are applied via the input probe 2I to a terminal 16C.

The address read out of the microcode memory 14 is provided to one input terminal 17A of a multiplexer 17. To another input terminal 17B of the multiplexer 17 is applied from an interrupt register 18 an address signal indicating an address to be jumped to at the time of an interruption, and still another input terminal 17C of the multiplexer 17 is supplied with an address signal from a stack file 19. The multiplexer 17 responds to the output of the microcode decoder 16 to select any one of the input terminals 17A, 17B and 17C to load the corresponding address into the program counter 15. The external control signals from the input probe 2T are plural, as mentioned above, and these external control signals are encoded by an encoder 16D. The encoded output $B_1B_2B_3$ and a status specifying code $A_1A_2A_3$ at the time of an IF statement read out of the microcode memory 14 are compared by a coincidence detector 16E. When coincidence is detected, an inhibit gate 16F is closed to produce "0", which enables the microcode decoder 16, allowing execution of the instruction accompanied by the IF statement, but when coincidence is not detected, the signal indicating the IF statement causes the gate 16F to output "1" which is applied to the microcode decoder 16 to disable it The instructions that are read out of the microcode memory 14 are INC, JUMP, CALL and RETURN instructions. Usually, the INC instruction is mainly read out. The count value of the program counter 15 is incremented by counting one PG clock pulse from the terminal 2b upon each occurrence of the INC instruction to advance the addresses of the pattern memory 2A and the microcode memory 14 one by one, and pattern data is read out of the pattern memory 2A and applied to the signal generator 2G, generating a pattern signal.

In the case of the JUMP instruction, a branch address read out of the microcode memory 14, along with the instruction, is loaded via the multiplexer 17 into the program counter 15 and then an instruction of the branched address area is executed, creating a pattern signal defined by this address area.

When the CALL instruction is read out of the microcode memory 14, a branch address of the microcode memory 14 is loaded into the program counter 15, and at the same time, the next program address of the CALL instruction is pushed in the stack file 19 at an address specified in accordance with the contents of a stack pointer 21. In the case of the RETURN instruction, the address retained in the stack file 19 at the time of execution of the CALL instruction is loaded into the program counter 15 and the pattern generation starts at the loaded address.

Where the INTERRUPT signal is input to the external control input terminal 16A, an instruction at the time of input is performed, after which the value of the program counter 15 is pushed in the stack file 19, and the contents of the interrupt register 18 are loaded into the program counter 15 and then an instruction of the address area starting at the loaded address is executed, producing a pattern signal determined by the instruction written in the address area.

In the case where the PAUSE signal is applied to the external control input terminal 16B, the microcode sequencer 2D stops execution of the program during the application of the PAUSE signal.

Figure 5:
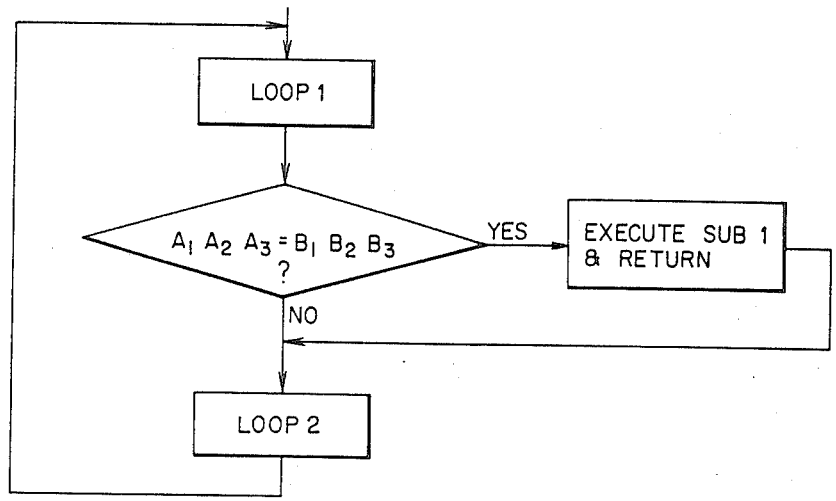
FIG. 5 is a flowchart showing an example of a part of the flow of a program stored in a microde memory 14 used in FIG. 4.

In the present invention, an instruction to be read out of the microcode memory 14 is added with an IF statement, as required, and when the instruction added with the IF statement is read out, if the status code $A_1A_2A_3$ specified by the instruction and a signal representing the status of the circuit under test 5, applied to the external control input terminal 16C, that is, the output $B_1B_2B_3$ of the encoder 16D, coincide with each other, then the signal "1" indicating the IF statement causes the inhibit gate 16F to produce "0", enabling decoder 16 to execute the instruction added with the IF statement. In other words, when an instruction $A_1A_2A_3$ IF CALL SUB 1 ($A_1A_2A_3$ being a status code), for example, is read out of the microcode memory 14, if the code coincides with a code $B_1B_2B_3$ (output from the encoder 16D) indicating the status of the circuit under test 5, applied to the external control input terminal 16C at that time, then the microcode decoder 16 operates to execute the instruction CALL SUB 1. FIG. 5 shows this in flowchart form.

In the example shown in FIG. 5, the test starts with the execution of an instruction LOOP 1 to generate test pattern signals. When the pattern signals defined by the instruction LOOP 1 are applied to the circuit under test 5, after completion of the test, the instruction $A_1A_2A_3$ IF CALL SUB 1 is read out. In this case, if the circuit under test 5 has correctly responded to the pattern signals applied so far and is in a predetermined status, the status output from the circuit under test 5 will coincide with the status represented by the status code $A_1A_2A_3$. Then the microcode decoder 16 performs the instruction IF CALL SUB 1, that is, the microcode decoder 16 jumps to an address being read out at that time and executes a subroutine SUB 1 to generate a series of test patterns and, at the end of the subroutine SUB 1, performs the RETURN instruction to return to the address pushed in the stack file 19 before it proceeds to the subroutine SUB 1, carrying out an instruction LOOP 2. In this example, after completing the execution of the instruction LOOP 2, the microcode decoder 16 responds to a jump instruction to return to the beginning of the instruction LOOP 1. This operation is repeatedly performed to test the circuit under test 5. If no coincidence is detected between the status codes $A_1A_2A_3$ and $B_1B_2B_3$ when the instruction $A_1A_2A_3$ IF CALL SUB 1 is read out, the instruction LOOP 2 will be further executed.

As described above, only when the conditions of the pattern generator 2 and the circuit under test 5 coincide with each other, can another test pattern be produced, so that if the status of the circuit under test 5 has reached a predetermined condition when one test is completed, another test can be made. Accordingly, the circuit under test 5 can be tested completely in all states. That is, according to the prior art, when the status of the circuit under test 5 satisfies a predetermined condition, the subroutine SUB 1 in the above example is performed, but it may sometimes be impossible, under the influence of an external signal, to predict when the circuit under test 5 reaches the condition (status), and in such an instance, the subroutine SUB 1 is carried out before the completion of the test desired to made. To avoid this, according to the prior art, a plurality of different tests are not performed in series but after the completion of a series of tests, another series of tests are initiated. According to the present invention, however, a plurality of different tests can be effected in series, and hence the time for testing can be reduced.

While in the above the instruction IF CALL SUB 1 is inserted between the instructions LOOP 1 and LOOP 2, it is also possible to detect the abovesaid coincidence upon each execution of one instruction which is read out of the microcode memory 14. In such a case, even if the operation of the circuit under test 5 is not fully pre-known, the test pattern signal can be switched to another one when the status of the circuit under test reaches a predetermined condition.

Further, although in the above the instruction IF CALL SUB 1 is executed as a modification of the pattern generation program, it is also possible to change the flow of the test program by executing another instruction, for example, IF JUMP 200.

Figure 6:
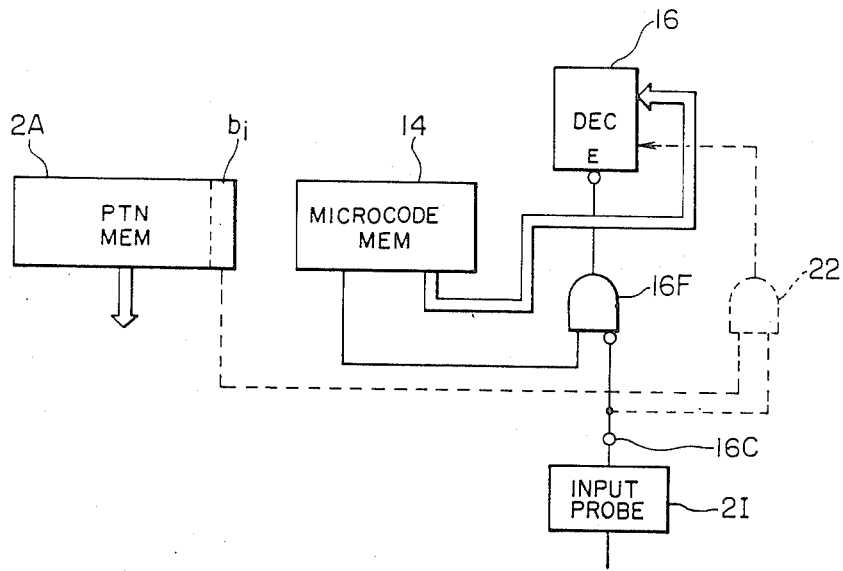
FIG. 6 is a block diagram illustrating a partly modified form of the microcode sequencer 2D.

It is sometimes detected from the state of one signal from the circuit under test 5 that its status has reached the predetermined condition, and in such a case, only one signal is provided from the input probe 21 and is applied directly to the inhibit gate 16F, as partly shown in FIG. 6, and the status code $A_1A_2A_3$ in the microcode memory 14 is omitted. Also it is possible to adopt such an arrangement as shown in FIG. 6 in which a bit representing the IF statement is stored in a specified bit area $b_i$ of the pattern memory 2A and when a "1" is read out of the specified bit area $b_i$, that is, when test data is output, coincidence between the output "1" from the bit area $b_i$ and the external control signal at the terminal 16c is detected by an AND circuit 22 and the detected output is applied to the decoder 16 and then a predetermined address is set in the program counter 15, that is, the decoder 16 jumps to that address.

With this kind of circuit test equipment, there are cases where a plurality of outputs from the circuit under test 5 are input into the memory 1B and further displayed as waveforms on the display unit 9, so that the operator judges whether the circuit under test 5 is correctly operating or not. To this end, it is necessary to know what test pattern signal is supplied to the circuit under test 5. Conventionally, the delay time $\tau_D$, the pulse width $\tau_W$ and the waveform of each test pattern signal are displayed by characters or symbols, but the present invention displays the waveform of each test pattern signal, along with such characters or symbols.

Figure 7:
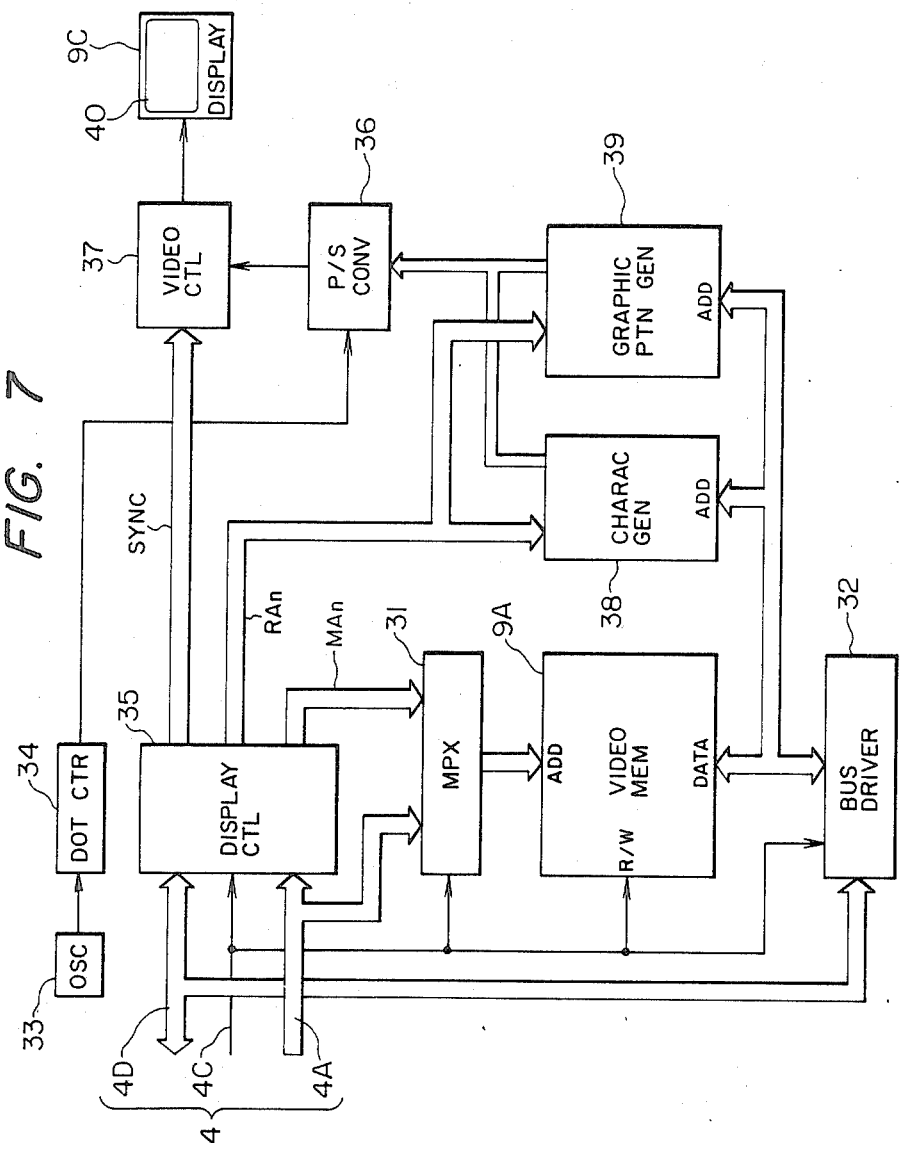
FIG. 7 is a block diagram illustrating a specific operative example of a display unit 9 utilized in FIG. 1.
Figure 8A:
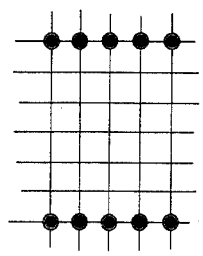
FIGS. 8A to 8F are diagrams showing examples of partial graphic forms stored in a graphic pattern generator 39 employed in FIG. 7.
Figure 8B:
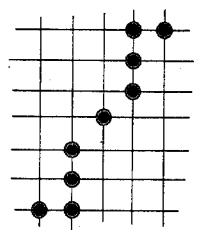
Figure 8C:
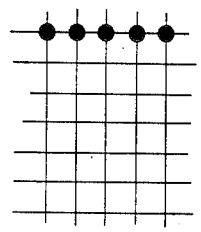
Figure 8D:
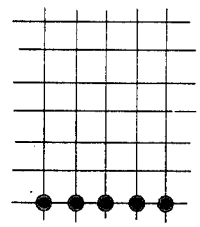
Figure 8E:
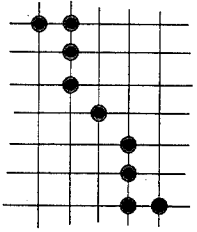
Figure 8F:
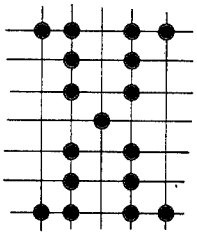

To perform this, the display unit 9 has such an arrangement, for example, as depicted in FIG. 7. An address bus 4A in the bus line 4 is connected to a multiplexer 31, the output side of which is connected to an address input side of the video memory 9A. A data bus 4D is connected via a bus driver 32 to a data terminal of the video memory 9A. A control line 4C is connected to a control terminal of the multiplexer 31, a read/write control terminal of the video memory 9A and an input/output control terminal of the bus driver 32. A write into the video memory 9A from the control unit 3 (FIG. 1) is effected by providing on the data bus 4D character data representing the characters, symbols and partial graphic forms to be written and, at the same time, providing on the address bus 4A an address corresponding to the number and the line on the display screen 40 of the scanning type display 9C on which the display is to be provided, and by providing a write command on the control line 4C. On the other hand, the output of a reference oscillator 33 is provided to a dot counter 34 to produce a dot clock, which is applied to a display controller 35 and a parallel-serial converter 36. A synchronizing signal is supplied from the display controller 35 to a video controller 37 and scanning control for the display 9C is effected by the video controller 37. From the display controller 35 is produced a readout address in synchronism with the abovesaid synchronizing signal, and the readout address is provided via the multiplexer 31 to the video memory 9A. The character data, which is read out of the video memory 9A is applied as an address to each of a character generator 38 and a graphic pattern generator 39. As is the case with an ordinary generator, these generators 38 and 39 have stored therein, as dot patterns, the characters, the symbols and the partial graphic forms to be displayed. On the basis of the character data read out of the video memory 9A and the address applied from the display controller 35 in synchronism with the synchronizing signal, the corresponding dot patterns are read out of the generators 38 and 39. The outputs therefrom are converted by the parallel-serial converter 36 into a serial dot pattern, which is provided as a display signal to the display 9C via the video controller 37. In this way, the character, symbol and partial graphic form stored in the video memory 9A are displayed on the screen of the display 9C. Incidentally, the write from the control unit 3 to the video memory 9A is effected in the vertical or horizontal fly-back period (blanking period) of the display 9C.

According to the present invention, in order that the waveform of each pattern signal from the pattern generator 2 is also displayed as mentioned above, a partial graphic form corresponding to one character in the case of the pattern signal waveform being displayed on the screen of the display 9C is stored in the graphic pattern generator 39. That is, dot patterns representing such graphic pattern segments "╳", "╲", "⋯", "⎯", "╭", and "═" as shown in FIGS. 8A to 8F are stored in the graphic pattern generator 39 and character codes corresponding to them are respectively determined. When the graphic pattern generator 39 is read out using the character codes, the corresponding dot patterns are obtained.

Figure 9:
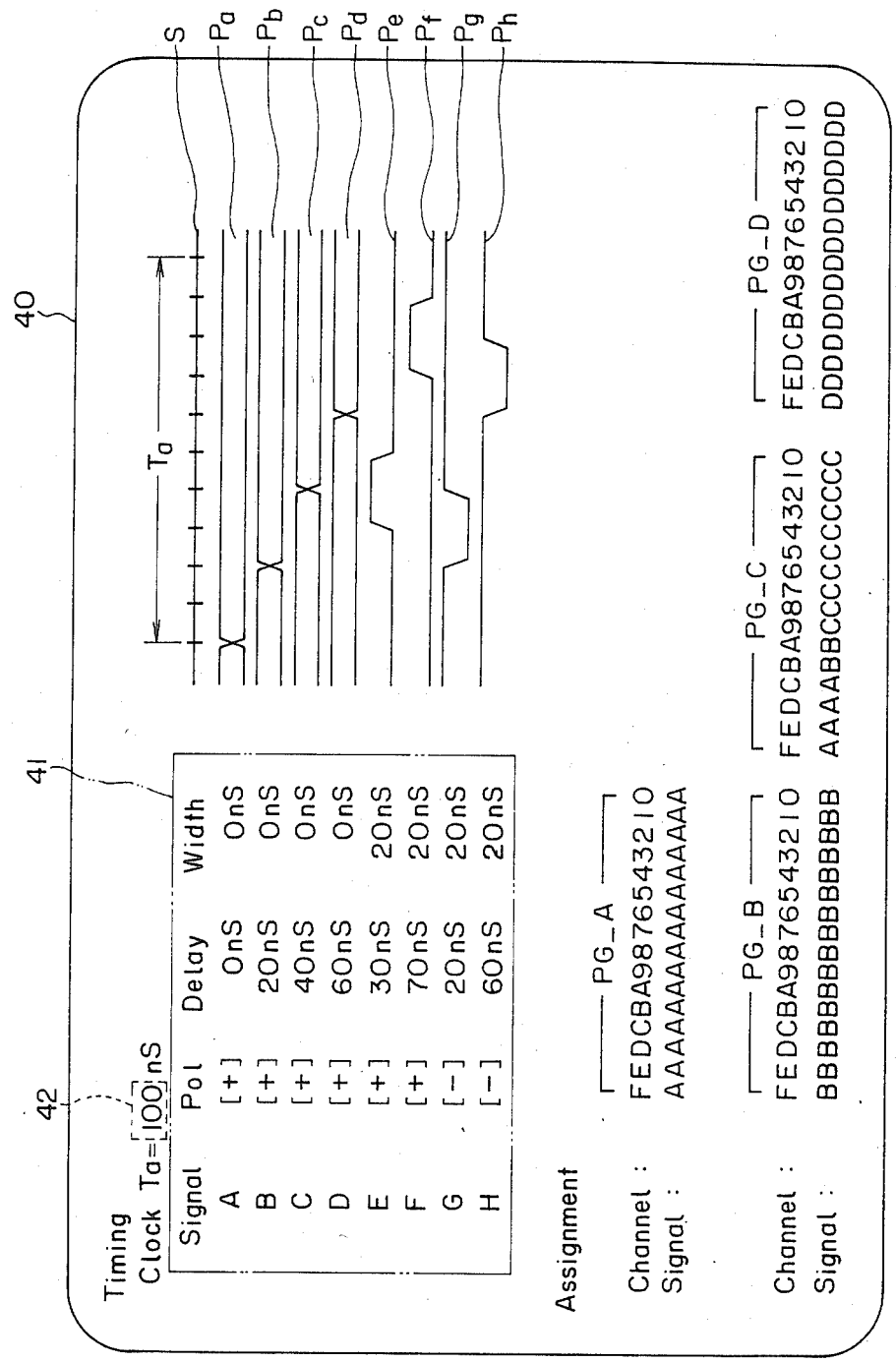
FIG. 9 is a diagram showing examples of displays provided on a display 9C.

For instance, when the signal generator 2G (FIG. 1) generates eight test patterns, they are displayed as A to H on the screen 40 of the display 9C and their polarities are also displayed with a sign + or −, and at the same time, the values of the delay time $\tau_D$ and the pulse width $\tau_W$ are displayed in a block indicated by the two-dot chain line in FIG. 9. In FIG. 9, the test pattern signal B is shown to be an NRZ waveform which is positive and has a delay time $\tau_D$ of 20 nsec but no pulse width $\tau_W$, and the test pattern signal H is shown to be an RZ waveform which is negative and has a delay time $\tau_D$ of 60 nsec and a pulse width $\tau_W$ of 20 nsec.

In the manner described above, the numeric values of the test pattern signals A to H are displayed and, in this example, their waveforms Pa, Pb, Pc, . . . and Ph, which are determined by the numeric values and symbols, are also displayed side by side with the numeric values. In FIG. 9 a scale S for the waveforms is also displayed.

To achieve waveform display, waveform display data is created on the basis of the data for the test pattern signals A to H and stored in the video memory 9A. The waveform display data is prepared by the control unit 3.

shows the state in which the pattern signal A is being output in all channels 0 to 15 (where A indicates the channel 10 and F the channel 15) of the probe group A; the state in which the pattern signal R is being output in all channels 0 to 15 of the probe group B; the state in which the pattern signal C is being output in channels 0 to 9 of the probe group C, the pattern signal B in channels 10 and 11 and the pattern signal A in channels 12 to 15; and the state in which the pattern signal D is being output in channels 0 to 15 of the probe group D. With the present invention, it is possible to output a desired pattern signal in a desired channel of each probe, as mentioned above.

As described above, according to the present invention, since the setting of pattern data is displayed not only in the form of characters and symbols but also as waveforms, the interrelation between the pattern signals can be confirmed at a glance. Accordingly, the present invention offers the advantage that the pattern data can be set easily and without fail.

While in the above embodiment the period Ta is divided into 10 graduations of the scale S, the number of division can be selected as desired. Further, the character generator 38 and the graphic pattern generator 39 can also be constructed as one unit.

It will be apparent that many modifications and variations may be effected without departing from the scope of the novel concepts of the present invention.

What is claimed is:

1. A logic analyzer for a circuit under test, producing as outputs, one of a circuit delay time and circuit pulse width based on groups of test pattern waveform signals supplied as an input to channels of the circuit and receiving from an external source selective data representing at least one of an input delay time relative to a reference timing and an input pulse width defining test conditions for each group of test pattern waveforms, comprising:

first memory means for sequentially storing the outputs of the circuit;

second memory means for storing pattern data and a program in address locations for generation of successive test patterns to be applied to the circuit;

input means for receiving as an input, from the external source, the selective data;

third memory means for storing the selective data;

a pattern generator, connected to said second memory means, said third memory means and the circuit, for generating test pattern waveform signals, based on a pattern generation clock signal, with a pattern delay time and a pattern pulse width corresponding to the selective data and for supplying the test pattern waveform signals to the input channels of the circuit;

code generating means, connected to said input means, for receiving from said input means the selective data, and generating addresses and character codes representing characters and graphic pattern segments to be displayed, said graphic pattern segments including a parallel-bar segment, a high level bar segment, a low level bar segment, a rising bar segment, a falling bar segment, and a cross-bar segment where the segments are used to represent the pattern delay time and pattern pulse width; and a display unit connected to said code generating means for receiving from said code generating means the character codes, and for displaying said delay time and pulse width data as both characters and graphic patterns for each of test patterns corresponding to said test pattern waveform signals, said display unit comprising:

a scanning type display having a screen and for selectively displaying on the screen thereof the conditions of Cthe test to be conducted and successive outputs from the circuit under test in characters, symbols and waveforms;

a video memory, connected to said code generating means, for storing the character codes of the characters and graphic pattern segments at said addresses corresponding to display positions on the screen of said scanning type display where the characters and graphic pattern segments are to be displayed;

display pattern generator means connected to said scanning type display, having stored therein dot patterns of the characters and graphic pattern segments at addresses corresponding to their character codes and for reading out therefrom the dot patterns of the characters and graphic pattern segments for display on the screen; and readout means, connected to said scanning type display, said display pattern generator means and said video memory, for sequentially reading out the character codes from said video memory in synchronism with scanning of said scanning type display and supplying the readout character codes as addresses to said display pattern generator means; and said code generating means, video memory means, readout means, display pattern generator means and scanning type display being interconnected to display the waveforms corresponding to the test conditions as a succession of the graphic pattern segments and the test conditions being displayed in characters in association with the corresponding waveforms on the screen of said scanning type display.

2. A logic analyzer according to claim 1, wherein each of the waveforms of the test conditions corresponding to the respective test patterns is one period long of the pattern generation clock signal and a scale with time base graduations is displayed adjacent one of the waveforms.

3. A logic analyzer according to claim 1, wherein said code generating means produces character codes representing the respective input channels of the circuit and the test patterns applied to the circuit allowing said display unit to display the input channels and the corresponding test patterns on the screen.

* * * * *

UNITED STATES PATENT AND TRADEMARK OFFICE
CERTIFICATE OF CORRECTION

PATENT NO. : 4,701,918
DATED : October 20, 1987
INVENTOR(S) : Nakajima et al.

It is certified that error appears in the above-identified patent and that said Letters Patent is hereby corrected as shown below:

Col. 1, line 31, "perform in" should be --performs an--;
line 68, delete "all";

Col. 2, line 1, before "its" insert --all--.

Col. 4, line 25, "with" should be --width--.

Col. 6, line 1, "1" should be --0--;
line 4, "NHZ" should be --NRZ--;
line 21, "21" should be --2I--.

Col. 7, line 24, "2T" should be --2I--;
line 36, after "it" insert --.--.

Col. 9, line 26, "21" should be --2I--.

Col. 10, line 50, "arc" should be --are--.

Col. 13, line 4, "R" should be --B--.

Col. 14, line 14, "Cthe" should be --the--.

Signed and Sealed this

Nineteenth Day of April, 1988

Attest:

DONALD J. QUIGG

Attesting Officer

Commissioner of Patents and Trademarks